(12) United States Patent
Peng et al.

(10) Patent No.: US 9,209,374 B2
(45) Date of Patent: Dec. 8, 2015

(54) METHOD FOR PREPARING AND USE OF $SB_2TE_3$ NANOCRYSTALS IN THERMOELECTRIC MATERIALS

(71) Applicant: Evident Technologies, Inc., Troy, NY (US)

(72) Inventors: Adam Z. Peng, Guilderland, NY (US); Susanthri Perera, Latham, NY (US); Dave Socha, Glenmont, NY (US); Clinton T. Ballinger, Ballston Spa, NY (US)

(73) Assignee: Evident Technologies, Inc., Troy, NY (US)

( * ) Notice: Subject to any disclaimer, the term of this patent is extended or adjusted under 35 U.S.C. 154(b) by 198 days.

(21) Appl. No.: 13/849,963

(22) Filed: Mar. 25, 2013

(65) Prior Publication Data

US 2013/0284989 A1    Oct. 31, 2013

Related U.S. Application Data

(60) Provisional application No. 61/616,620, filed on Mar. 28, 2012.

(51) Int. Cl.
| | | |
|---|---|---|
| *H01L 35/16* | (2006.01) | |
| *H01L 35/34* | (2006.01) | |
| *C01B 19/00* | (2006.01) | |
| *B82Y 30/00* | (2011.01) | |

(52) U.S. Cl.
CPC ............. *H01L 35/16* (2013.01); *B82Y 30/00* (2013.01); *C01B 19/007* (2013.01); *H01L 35/34* (2013.01); *C01P 2004/64* (2013.01); *C01P 2006/40* (2013.01); *C01P 2006/80* (2013.01)

(58) Field of Classification Search
USPC ............. 252/62.3 T; 423/509; 136/238
See application file for complete search history.

(56) References Cited

U.S. PATENT DOCUMENTS

| | | | |
|---|---|---|---|
| 2006/0060998 A1* | 3/2006 | Strouse et al. ............ 264/5 |
| 2006/0102224 A1* | 5/2006 | Chen et al. ............... 136/203 |
| 2010/0170552 A1* | 7/2010 | Murai et al. ............. 136/205 |

* cited by examiner

*Primary Examiner* — Carol M Koslow
(74) *Attorney, Agent, or Firm* — Hoffman Warnick LLC

(57) ABSTRACT

Disclosed are a thermoelectric material and a method of forming a thermoelectric material having an optimal stoichiometry, the method including obtaining a first precursor material, wherein the first precursor material is an antimony precursor, and obtaining a second precursor material, wherein the second precursor is chosen from the group consisting of a tellurium precursor and a selenium precursor. The method further includes combining the precursor materials, heating the combination of precursor materials, and isolating a plurality of semiconductor nanocrystals from the heated precursor materials.

12 Claims, No Drawings

METHOD FOR PREPARING AND USE OF $Sb_2Te_3$ NANOCRYSTALS IN THERMOELECTRIC MATERIALS

CROSS-REFERENCE TO RELATED APPLICATIONS

This application claims the benefit of co-pending U.S. Provisional Application Ser. No. 61/616,620, filed 28 Mar. 2012, which is hereby incorporated by reference herein.

FIELD OF THE INVENTION

Embodiments of the present invention relate generally to methods of preparing and using antimony telluride semiconductor nanocrystals for both nanostructured and bulk thermoelectric materials.

BACKGROUND OF THE INVENTION

Thermoelectric devices are especially attractive devices because they do not contain moving parts, they can be environmentally benign, and they may be easily incorporated into technologies for heat removal or for energy conversion. Thermoelectric devices, however, currently have limited use in the marketplace, which is largely a result of their low efficiencies.

While the true momentum behind research in low-dimensional thermoelectrics began in the 1990s, a limited understanding of the complex phenomena underlying the thermoelectric properties associated with low-dimensional structures has slowed progress in this area.

There has been a great deal of recent research focused on determining the optimal material systems for thermoelectric applications. The ideal electronic structure appears to include a discrete distributed density of electron states, which may be approximated by a nanostructured material that is constructed of discrete semiconductor nanocrystals. Creating this ideal material has proven very difficult because the nanocrystals are typically connected using organic surface molecules to "glue" them into a monolithic, nano-structure. These organic interconnects between the discrete nanocrystals greatly reduce the electrical conductivity and leads to poor overall material performance.

Some previous attempts have utilized zintl ions. The primary advantage of using zintl ions as nanocrystal surface ligands is to convert them into crystalline metal chalcogenides, thus linking the individual nanoscale building blocks into a macroscopic assembly of electronically coupled functional modules. This method preserves the benefits of nanostructuring and quantum confinement effects while enabling charge transport through interparticle boundaries.

SUMMARY OF THE INVENTION

A first aspect of the present invention includes a method of forming a thermoelectric material having an optimal stoichiometry, the method comprising: obtaining a first precursor material, wherein the first precursor material is an antimony precursor; obtaining a second precursor material, wherein the second precursor is chosen from the group consisting of: a tellurium precursor and a selenium precursor; combining the precursors; heating the combination of precursors; and isolating a plurality of semiconductor nanocrystals from the heated precursors.

A second aspect of the present invention includes a thermoelectric material comprising: at least one of a group consisting of: $Sb_2Te_3$ and $Sb_2Se_3$; and at least one of a group consisting of: a bulk thermoelectric material, a pulverized bulk thermoelectric material, and at least one other thermoelectric semiconductor nanocrystal material.

DESCRIPTION OF THE INVENTION

One embodiment of the current invention includes a special surface chemistry that uses short chain inorganic surface ligands instead of the traditional organic molecules. The short chain inorganic ligand system can help to enable a technology for producing high quality electronically coupled materials. The ligand system is unique in that purely inorganic metal chalcogenide complexes are used to passivate the colloidal nanocrystals. To date, this methodology is the first such known to produce films and bulk structures from colloidal nanoparticles that have transport properties useful for electronic applications while still maintaining their low dimensional properties. Unlike other prior technologies utilizing colloidal nanoparticles, this approach does not rely on organic materials to provide electronic coupling between the nanoparticles. As a result, the operating temperature is not limited by decomposition of organic molecules.

For example, BiSbTe and BiTeSe bulk systems used to produce p and n-type thermoelectric materials, respectively, have been some of the more common bulk thermoelectric systems in previous materials. Nanocrystal-based systems or a mixture of nanocrystals and traditional bulk materials can show an improvement in thermoelectric operation over bulk thermoelectric metrics. For instance, most bulk materials fail to achieve ZT values of 1.0. An embodiment of the current invention includes a method for preparing a completely bottom up, colloidally-grown system comprising, for instance, nanostructured antimony telluride or nanostructured antimony selenide particles as the original starting materials.

The removal of organic materials from current embodiments has allowed the electrical conductivity to increase relative to the use of bulk materials, while maintaining the nanostructure needed to keep the thermal conductivity low. This material system may achieve ZT values of more than approximately 1.0, or in some embodiments up to at least 1.5. Further embodiments may result in a ZT value of up to about 2.0.

Bulk material antimony telluride and antimony selenide purchased from suppliers can often be difficult to solvate due to large grain sizes and oxidation that can take place on the surface of the crystals. Embodiments of the current invention include a method to produce colloidally grown antimony telluride and antimony selenide nanocrystals such that grain size and oxidation can be controlled by utilizing a bottom up technique. Further embodiments include the introduction of these nanomaterials as zintl ions in a material, for instance into a thermoelectric material. These thermoelectric semiconductor nanocrystals can be mixed with both traditional bulk thermoelectric materials, either in alloyed form or pulverized into micro or nano size, or mixed with other colloidally grown thermoelectric semiconductor nanocrystals.

This method can involve precursor materials being reacted together to arrive at a final optimal material with a controlled stoichiometry. In some embodiments, the optimal controlled stoichiometry may include $Sb_2Te_3$ and $Sb_2Se_3$ as non-limiting examples. In one embodiment, an antimony precursor is obtained, either by purchasing it or synthesizing it. A tellurium or selenium precursor may also be purchased or synthesized. These precursors may be mixed into a solvent or two or more different solvents. If separately dissolved, the two solutions can then be added to one another. In some embodiments, the second precursor, the tellurium or selenium precursor, for instance Te/TBP or Se/TBP respectively, can be injected into a solution containing the antimony precursor. This combined solution may then be heated, although in some embodiments at least one of the precursors will be heated prior to the addition of the other. This heating may take place at approximately 120° C. up to about 200° C. For instance, the antimony precursor solution may be heated up to about 150° C. prior to injection of the tellurium or selenium precursor.

Once the two precursors have been combined, the resulting solution may be held at a particular temperature, typically referred to as incubated. In some embodiments, this incubation process takes place at or around 90° C. to approximately 150° C. In one example, an incubation of 130° C. is used. An incubation period allows for the precursors to combine and begin crystallizing into the desired nanocrystals. In some embodiments, the incubation period may be for as little as a few minutes, or up to about half an hour. The resultant nanocrystals may then be isolated by any means necessary. For instance, the solution may be put into a centrifuge to separate the solid nanocrystals and the liquid. Whether centrifuged or not, the supernatant (liquid) can be poured off from the solids. In some embodiments, this solid may be washed with chloroform, anhydrous toluene, hexane, or some combination of these materials. In one embodiment, after the nanocrystals have been washed, they can be placed in a vacuum or an oven and allowed to dry, further processing the nanocrystals. In one embodiment, the nanocrystals may be allowed to dry under a vacuum overnight.

In a further embodiment, the antimony telluride and/or antimony selenide nanocrystals can be utilized for the purpose of preparing a thermoelectric material. For instance, the final thermoelectric material may contain the above described colloidally grown $Sb_2Te_3$ and/or $Sb_2Se_3$ nanocrystals. These nanocrystals may be used alone, or may be mixed with traditional bulk thermoelectric materials, a pulverized bulk thermoelectric material, other nanocrystal thermoelectric materials, or any combination thereof. It is noted that although some examples are given regarding specific chemicals, these examples are not intended to be limiting.

Below is provided an example synthesis useful in practicing various embodiments of the invention.

EXAMPLE 1

11.95 g of antimony(III) acetate (an antimony precursor), 34.6 g octanoic acid and 130 g octadecene (ODE) are stirred together in a round bottom flask. A mixture of 7.656 g of tellurium powder (a tellurium precursor) and 60 g of tributyl phosphate (TBP) is prepared and placed in a sonicator until the mixture is clear. The Te/TBP solution is injected into the antimony acetate solution at approximately 150° C. Following the injection, the mixture is incubated at approximately 130° C. for approximately 10 minutes. The resulting $Sb_2Te_3$ material is allowed to crystallize, and the supernatant solution is poured off. The $Sb_2Te_3$ crystallized material (nanocrystals) is washed twice with about 100 mL of chloroform ($CHCl_3$), followed by a wash with anhydrous toluene and hexane. The resultant powder is isolated and allowed to dry in a vacuum.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed:

1. A method of forming a thermoelectric material having an optimal stoichiometry,
    the method comprising:
        obtaining a first precursor material, wherein the first precursor material is an antimony precursor;
        obtaining a second precursor material, wherein the second precursor material is chosen from the group consisting of: a tellurium precursor and a selenium precursor;
        combining the precursors;
        heating the combination of precursors;
        incubating the combination of precursor materials for at least 10 minutes; and
        isolating a plurality of semiconductor nanocrystals from the heated precursors.

2. The method of claim 1, wherein the first precursor material comprises antimony(III) acetate.

3. The method of claim 1, wherein the second precursor material comprises a Te/TBP solution.

4. The method of claim 1, wherein the heating takes place at approximately 150° C.

5. The method of claim 1, wherein the second precursor material comprises a Se/TBP solution.

6. The method of claim 1, wherein the incubating is done at approximately 130° C.

7. The method of claim 1, further comprising:
    washing the plurality of semiconductor nanocrystals with at least one of: CHCl, anhydrous toluene, and hexane.

8. The method of claim 7, further comprising:
    drying the washed plurality of semiconductor nanocrystals under a vacuum until the nanocrystals recrystalize.

9. The method of claim 1, further comprising:
    combining the plurality of semiconductor nanocrystals with at least one of a group consisting of: a bulk thermoelectric material, a pulverized bulk thermoelectric material, and at least one other thermoelectric semiconductor nanocrystal material.

10. A thermoelectric material comprising:
    a first material, wherein the first material includes at least one of a group consisting of: $Sb_2Te_3$ and $Sb_2Se_3$ and
    a second material, wherein the second material includes, a pulverized bulk thermoelectric material.

11. The thermoelectric material of claim 10, wherein a ZT value of the thermoelectric material is at least 1.

12. The thermoelectric material of claim 11, wherein the ZT value of the thermoelectric material is at least 1.5.

* * * * *